(12) United States Patent
Kim et al.

(10) Patent No.: US 12,733,487 B2
(45) Date of Patent: Sep. 8, 2026

(54) SEMICONDUCTOR PACKAGE

(71) Applicant: SAMSUNG ELECTRONICS CO., LTD., Suwon-si (KR)

(72) Inventors: Youngdeuk Kim, Suwon-si (KR); Mina Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 428 days.

(21) Appl. No.: 18/243,437

(22) Filed: Sep. 7, 2023

(65) Prior Publication Data

US 2024/0087976 A1 Mar. 14, 2024

(30) Foreign Application Priority Data

Sep. 8, 2022 (KR) ........................ 10-2022-0114469

(51) Int. Cl.

*H01L 23/36* (2006.01)
*H01L 23/00* (2006.01)
*H01L 23/42* (2006.01)
*H01L 25/065* (2023.01)
*H10B 80/00* (2026.01)

(Continued)

(52) U.S. Cl.

CPC ............ *H10W 40/10* (2026.01); *H10B 80/00* (2023.02); *H10W 40/70* (2026.01); *H10W 90/00* (2026.01); *H10W 72/07354* (2026.01); *H10W 72/347* (2026.01); *H10W 72/877* (2026.01); *H10W 74/15* (2026.01); *H10W 90/288* (2026.01); *H10W 90/724* (2026.01); *H10W 90/734* (2026.01); *H10W 90/736* (2026.01)

(58) Field of Classification Search

CPC ......... H01L 23/36; H01L 23/42; H01L 24/32; H01L 24/16; H01L 24/33; H01L 24/73; H01L 25/0652; H01L 2224/16225; H01L 2224/32225; H01L 2224/32245; H01L 2224/33181; H01L 2224/73204; H01L 2224/73253; H01L 2225/06589; H10B 80/00; H10W 40/10; H10W 40/70; H10W 90/00; H10W 90/724; H10W 90/288; H10W 90/734; H10W 90/736; H10W 72/877; H10W 72/347; H10W 72/07354; H10W 74/15

See application file for complete search history.

(56) References Cited

U.S. PATENT DOCUMENTS 6,724,078 B1 * 4/2004 Sur ........................ H01L 24/31
257/E23.09
9,293,428 B2 3/2016 Sauciuc (Continued)

FOREIGN PATENT DOCUMENTS

JP 2567442 B2 12/1996
JP 6520656 B2 5/2019

*Primary Examiner* — Peniel M Gumedzoe
(74) *Attorney, Agent, or Firm* — Sughrue Mion, PLLC

(57) ABSTRACT

Provided is a semiconductor package including a first substrate, a first chip structure on the first substrate, the first chip structure including at least one chip, a heat dissipation member on the first chip structure, the heat dissipation member including a heat dissipation plate including a first surface facing the first chip structure and a second surface opposite to the first surface and a seed metal layer on the second surface of the heat dissipation plate, and a metal thermal interfacial material (TIM) on the seed metal layer.

19 Claims, 6 Drawing Sheets

(51) Int. Cl.

| | |
|---|---|
| ***H10W 40/10*** | (2026.01) |
| ***H10W 40/70*** | (2026.01) |
| ***H10W 90/00*** | (2026.01) |
| *H10W 72/00* | (2026.01) |
| *H10W 72/30* | (2026.01) |
| *H10W 74/15* | (2026.01) |
| *H10W 90/20* | (2026.01) |

(56) References Cited

U.S. PATENT DOCUMENTS

| | | | | |
|---|---|---|---|---|
| 10,163,755 | B2 | 12/2018 | Vadhavkar et al. | |
| 10,607,857 | B2 | 3/2020 | Berntson et al. | |
| 11,043,440 | B2 | 6/2021 | Kim et al. | |
| 2009/0057877 | A1* | 3/2009 | Touzelbaev | H01L 23/3737 257/706 |
| 2015/0069596 | A1 | 3/2015 | Kawasaki et al. | |
| 2017/0162542 | A1* | 6/2017 | Chen | H01L 23/367 |
| 2021/0280493 | A1* | 9/2021 | Su | H05K 1/0209 |
| 2023/0026141 | A1* | 1/2023 | Chen | H01L 25/0655 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0114469, filed on Sep. 8, 2022, in the Korean Intellectual Property Office, the disclosure of which is incorporated by reference herein in its entirety.

BACKGROUND

Embodiments of the present disclosure relate to a semiconductor package, and more particularly, to a semiconductor package having an improved thermal characteristic.

As the electronics industry advances rapidly and the demands of users increases, electronic devices are becoming more miniaturized and made lighter. As electronic devices are miniaturized and made lighter, semiconductor packages are becoming miniaturized and lighter, and moreover, require higher performance, larger capacity, and higher reliability. As such semiconductor packages have higher performance and larger capacity, power consumption of the semiconductor packages is increasing. Therefore, the significance of heat dissipation characteristics, corresponding to size/performance, of semiconductor packages is further increasing.

SUMMARY

One or more embodiments provide a semiconductor package having improved heat dissipation characteristics.

According to an aspect of an embodiment, there is provided a semiconductor package including a first substrate, a first chip structure on the first substrate, the first chip structure including at least one chip, a heat dissipation member on the first chip structure, the heat dissipation member including a heat dissipation plate including a first surface facing the first chip structure and a second surface opposite to the first surface and a seed metal layer on the second surface of the heat dissipation plate, and a metal thermal interfacial material (TIM) on the seed metal layer.

According to another aspect of an embodiment, there is provided a semiconductor package including a first substrate, a first chip structure and a second chip structure in a first horizontal direction on the first substrate, a heat dissipation member on the first chip structure and the second chip structure, the heat dissipation member including a heat dissipation plate that includes a first surface facing the first chip structure and the second chip structure and a second surface opposite to the first surface and a seed metal layer on the second surface of the heat dissipation plate, and a metal thermal interfacial material (TIM) on the seed metal layer.

According to another aspect of an embodiment, there is provided a semiconductor package including a package substrate, an interposer substrate on the package substrate, a first chip structure on the interposer substrate, the first chip structure including at least one chip, a second chip structure on the interposer substrate and spaced apart from the first chip structure in a first horizontal direction, a heat dissipation member on the first chip structure and the second chip structure, the heat dissipation member including a heat dissipation plate that includes a first surface facing the first chip structure and the second chip structure and a second surface opposite to the first surface, and a seed metal layer on the second surface of the heat dissipation plate, a first adhesive layer between the first chip structure and the heat dissipation member, and a metal thermal interfacial material (TIM) on the seed metal layer, wherein one of the first chip structure and the second chip structure includes a logic chip, and the other of the first chip structure and the second chip structure includes a high bandwidth memory (HBM) package including a plurality of memory chips in a vertical direction, and wherein the seed metal layer includes seed metal forming the metal TIM.

BRIEF DESCRIPTION OF DRAWINGS

Embodiments will be more clearly understood from the following detailed description taken in conjunction with the accompanying drawings in which:

FIG. 1 is a cross-sectional view schematically illustrating a semiconductor package according to an embodiment;

FIG. 3 is a cross-sectional view schematically illustrating a semiconductor package according to an embodiment;

FIG. 4 is a cross-sectional view schematically illustrating a semiconductor package according to an embodiment;

FIG. 5 is a cross-sectional view schematically illustrating a semiconductor package according to an embodiment; and FIG. 6 is a cross-sectional view schematically illustrating a semiconductor package according to an embodiment.

DETAILED DESCRIPTION OF EMBODIMENTS

Figure 2:
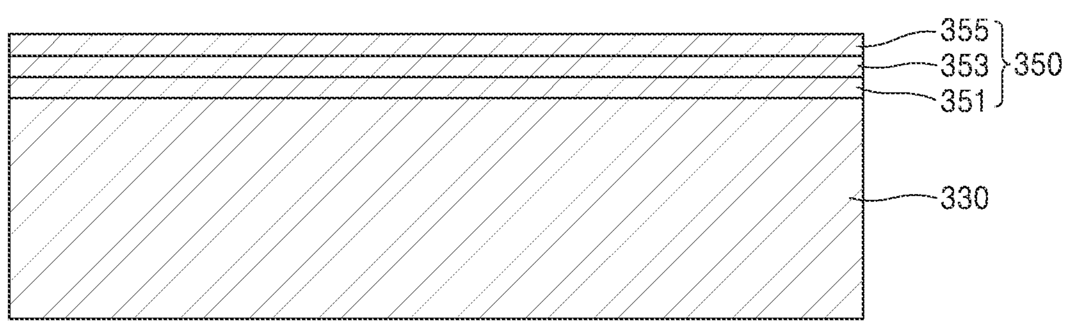
FIG. 2 is a cross-sectional view for describing a heat dissipation member of the semiconductor package of FIG. 1.
Figure 2:
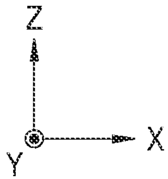

Hereinafter, embodiments will be described in detail with reference to the accompanying drawings. Like reference numerals refer to like elements in the drawings, and their repeated descriptions are omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Embodiments described herein are example embodiments, and thus, the disclosure is not limited thereto.

Figure 1:
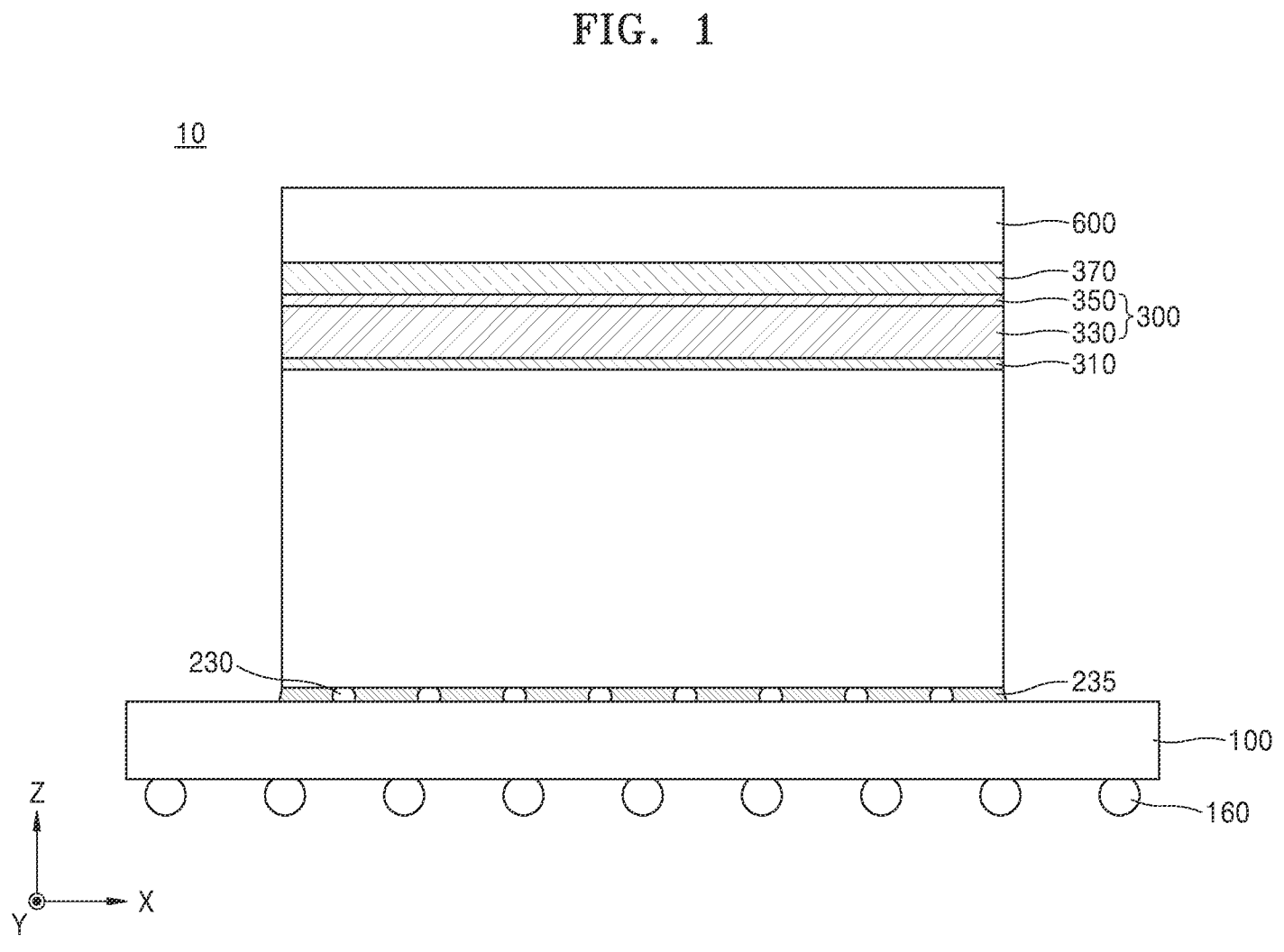

FIG. 1 is a cross-sectional view schematically illustrating a semiconductor package 10 according to an embodiment.

Referring to FIG. 1, the semiconductor package 10 may include a first substrate 100, a first external connection terminal 160, a first chip structure 200, a first adhesive layer 310, a heat dissipation member 300, and a metal thermal interfacial material (TIM) 370.

The first substrate 100 may be disposed under the first chip structure 200 and may be electrically connected to the first chip structure 200. According to embodiments, the first substrate 100 may be formed based on, for example, a ceramic substrate, a printed circuit board (PCB), a glass substrate, or an interposer substrate. Also, in some embodiments, the first substrate 100 may include a redistribution structure.

The first external connection terminal 160 may be disposed on a lower surface of the first substrate 100. The first external connection terminal 160 may be electrically connected to an external device (for example, a mother board, a PCB, or a package substrate). The first external connection terminal 160 may be electrically connected to wiring patterns, formed in the first substrate 100, through a substrate pad attached on the lower surface of the first substrate 100. The first external connection terminal 160 may electrically and physically connect the semiconductor package 10 to an external device with the semiconductor package 10 disposed thereon. The first external connection terminal 160 may include a conductive material such as, for example, a solder, tin (Sn), silver (Ag), copper (Cu), and aluminum (Al).

The first chip structure 200 may be disposed on an upper surface of the first substrate 100. According to embodiments, the first chip structure 200 may be disposed on the first substrate 100 through a first bump structure 230 such as a micro bump, based on, for example, a flip chip scheme.

The first bump structure 230 may include a conductive material such as, for example, at least one of a solder, Sn, Ag, Cu, and Al. In embodiments, an under-fill material layer 235 provided adjacent to and surrounding the first bump structure 230 may be disposed between the first chip structure 200 and the first substrate 100. The under-fill material layer 235 may include, for example, epoxy resin formed by a capillary under-fill process. However, embodiments are not limited thereto. For example, a first molding member 250 (see FIG. 3) or a second molding member 50 (see FIG. 4) may be directly filled into a gap between the first chip structure 200 and the first substrate 100 through a molded under-fill process. In this case, the under-fill material layer 235 may be omitted.

The first chip structure 200 may include at least one semiconductor chip. For example, the semiconductor chip may include a logic semiconductor chip or a memory semiconductor chip. The logic semiconductor chip may include, for example, a microprocessor such as a central processing unit (CPU), a graphics processing unit (GPU), or an application processor (AP), an analog device, or a digital signal processor. The memory semiconductor chip may include, for example, a volatile memory chip, such as dynamic random access memory (DRAM) or static random access memory (SRAM), or a non-volatile memory chip such as Phase-change Random Access Memory (PRAM), magnetoresistive random access memory (MRAM), ferroelectric random access memory (FeRAM), or resistive random access memory (RRAM).

The first chip structure 200 may include semiconductor chips which are disposed in one direction. In the following drawings, an X-axis direction and a Y-axis direction may each denote a direction parallel to a surface of a top or a bottom of the first chip structure 200, or may be directions perpendicular to each other. A Z-axis direction may denote a direction perpendicular to the surface of the top or the bottom of the first chip structure 200. In other words, the Z-axis direction may be a direction perpendicular to an X-Y plane. Also, in the following drawings, a first horizontal direction, a second horizontal direction, and a vertical direction may be understood as follows. The first horizontal direction may be understood as the X-axis direction, the second horizontal direction may be understood as the Y-axis direction, and the vertical direction may be understood as the Z-axis direction.

According to embodiments, the first chip structure 200 may include semiconductor chips which are disposed in the vertical direction Z. This is described below in detail with reference to FIG. 3.

The heat dissipation member 300 may be disposed on an upper surface of the first chip structure 200. The heat dissipation member 300 may be attached on the first chip structure 200 by the first adhesive layer 310.

The first adhesive layer 310 may be disposed between the first chip structure 200 and the heat dissipation member 300. According to embodiments, the first adhesive layer 310 may be a layer which is configured to attach the heat dissipation member 300 on the first chip structure 200. The first adhesive layer 310 may be a film having an adhesive characteristic autonomously. For example, the first adhesive layer 310 may be a double-sided attach film. According to embodiments, the first adhesive layer 310 may include a tape-type material layer, a liquid coating cure material, or a combination thereof. Also, the first adhesive layer 310 may include a thermal setting structure, thermal plastic, an ultraviolet (UV) cure material, or a combination thereof. The first adhesive layer 310 may be referred to as a die attach film (DAF) or a non-conductive film (NCF).

The heat dissipation member 300 may include a heat dissipation plate 330 and a seed metal layer 350. The heat dissipation plate 330 may include a lower surface facing the first chip structure 200 and an upper surface opposite to the lower surface of the heat dissipating plate 330. The lower surface of the heat dissipation plate 330 may be attached on the first adhesive layer 310. The heat dissipation plate 330 may include, for example, a heat slug or a heat sink. In embodiments, the heat dissipation plate 330 may include a solid or a flat plate including a metal material. The heat dissipation plate 330 may include, for example, Cu, a Cu alloy, Al, an Al alloy, steel, stainless steel, and a high thermal conductive material formed by a combination thereof.

The seed metal layer 350 may be formed on an upper surface of the heat dissipation plate 330. The seed metal layer 350 may include seed metal for forming a metal TIM. The seed metal layer 350 may be used in an electroplating process for forming a metal TIM 370. A configuration of the seed metal layer 350 is described below in detail with reference to FIG. 2.

According to embodiments, a sum of thicknesses of the first adhesive layer 310 and the heat dissipation member 300 in the vertical direction Z may be within a range of about 100 μm to about 150 μm, but is not limited thereto.

The metal TIM 370 may be formed on the seed metal layer 350. The metal TIM 370 may be disposed between the heat dissipation member 300 and a cooling system 600 and may attach the cooling system 600 on the heat dissipation member 300. The cooling system 600 may be configured to provide a path through which heat occurring in the semiconductor package 10 is dissipated to the outside. According to embodiments, the cooling system 600 may cool the semiconductor package 10 by using, for example, a convection process using a fan, a conduction process using a water cooling device, or a process of extending an external contact area by using a heat sink, but is not limited thereto.

According to embodiments, a thermal conductivity of the metal TIM 370 may be within a range of about 50 W/mK to about 100 W/mK. The metal TIM 370 may include an insulation material, or may include a material which includes an insulation material and may maintain electrical insulation properties.

FIG. 2 is a cross-sectional view for describing a heat dissipation member of the semiconductor package 10 of FIG. 1.

Referring to FIG. 2, a heat dissipation member 300 may include a heat dissipation plate 330 and a seed metal layer 350. The heat dissipation plate 330 may be substantially the same as or similar to the description of FIG. 1, and thus, repeated descriptions thereof may be omitted and a difference is mainly described.

The seed metal layer 350 may be formed on an upper surface of the heat dissipation plate 330. According to embodiments, the seed metal layer 350 may include three layers. The three layers may include a first layer 351, a second layer 353, and a third layer 355, the first layer 351 may be disposed on an upper surface of the heat dissipation plate 330, the second layer 353 may be disposed on the first layer 351, and the third layer 355 may be disposed on the second layer 353. That is, the seed metal layer 350 may include three layers which are disposed in a vertical direction Z. In the drawings, the seed metal layer 350 is illustrated as including three layers, but the seed metal layer 350 is not limited thereto and may include one or more layers for forming a metal TIM 370.

The seed metal layer 350 may include various metal materials. According to embodiments, the first layer 351 may include titanium, the second layer 353 may include nickel, and the third layer 355 may include gold, but embodiments are not limited thereto.

In the semiconductor package 10 according to an embodiment described above with reference to FIGS. 1 and 2, a heat dissipation member 300 may be provided on the first chip structure 200, and the heat dissipation member 300 may be provided on an upper surface of the heat dissipation plate 330 in a state where the seed metal layer 350 is formed. Accordingly, in the semiconductor package 10, the metal TIM 370 may be formed on the heat dissipation member 300 through the seed metal layer 350. The metal TIM 370 may have a thermal conductivity which is 10 times or more than the thermal conductivity of a general TIM, and thus, the semiconductor package 10 including the metal TIM 370 may more efficiently dissipate heat, occurring therein, up to the cooling system 600.

Also, the heat dissipation member 300 including the seed metal layer 350 may be attached on the first chip structure 200 by the first adhesive layer 310. Accordingly, the heat dissipation member 300 including the seed metal layer 350 may be attached on the first chip structure 200 without a separate process, and thus, a process of attaching the heat dissipation member 300 may be simplified and heat occurring in the semiconductor package 10 may be more efficiently dissipated.

Moreover, as the seed metal layer 350 is formed on the heat dissipation plate 330 of the heat dissipation member 300, a direct force may not be applied to the first chip structure 200 in a process of forming the seed metal layer 350, and thus, damage to the first chip structure 200 may be reduced or prevented, thereby improving the reliability of a semiconductor package 10.

Figure 3:
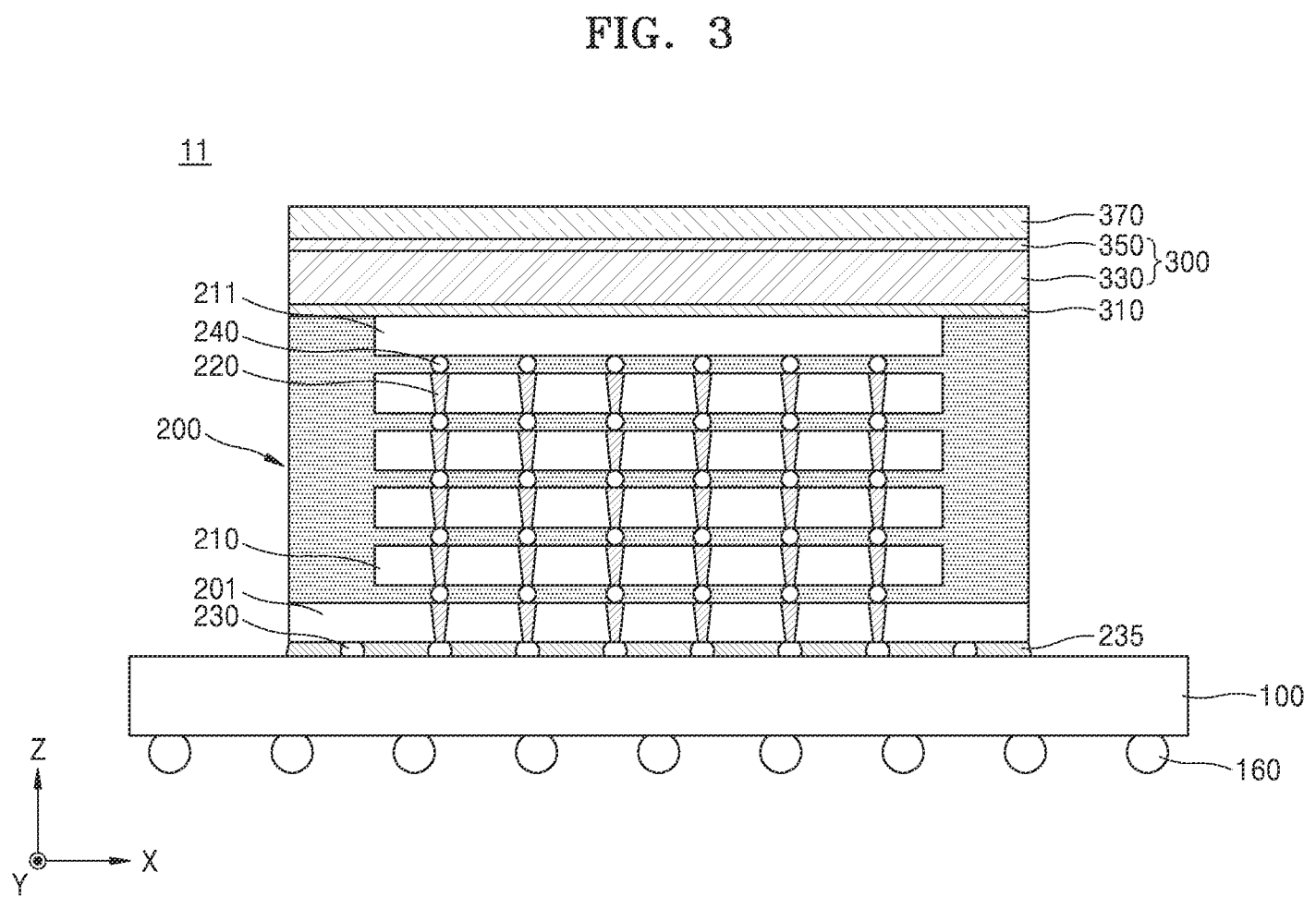

FIG. 3 is a cross-sectional view schematically illustrating a semiconductor package 11 according to an embodiment. Hereinafter, descriptions of the semiconductor package 11 of FIG. 3 which are the same as or similar to the descriptions of the semiconductor package 10 of FIG. 1 may be omitted, and a difference therebetween is mainly described.

Referring to FIG. 3, the semiconductor package 11 may include a first substrate 100, a first chip structure 200, a first adhesive layer 310, a heat dissipation member 300, and a metal TIM 370. The first chip structure 200 may include semiconductor chips which are disposed in a vertical direction. According to embodiments, the semiconductor chips may each be a high bandwidth memory (HBM) dynamic random access memory (DRAM) chip and may be semiconductor chips which are used in HBM packages. According to embodiments, the first chip structure 200 may include a base chip 201 and semiconductor chips 210 on the base chip 201. The base chip 201 and the semiconductor chips 210 may include a through via 220 therein. Furthermore, a top-layer semiconductor chip 211, which is a semiconductor chip disposed uppermost, of the semiconductor chips 210 may not include the through via 220.

According to embodiments, the base chip 201 may include logic devices. Accordingly, the base chip 201 may be a logic chip. The base chip 201 may be disposed under the semiconductor chips 210 and may transfer signals of the semiconductor chips 210 externally, and moreover, may transfer power and a signal, provided externally, to the semiconductor chips 210. Therefore, the base chip 201 may be referred to as a buffer chip or a control chip. Furthermore, the semiconductor chips 210 may each include memory devices (for example, DRAM devices). The semiconductor chips 210 may each be referred to as a memory chip or a core chip.

The semiconductor chips 210 may be disposed on the base chip 201 through, for example, pad-to-pad bonding, bonding using a bonding member, or bonding using anisotropic conductive film (ACF). According to embodiments, the semiconductor chips 210 may be disposed on the base chip 201 or a semiconductor chip 210 disposed directly under the semiconductor chip 201, through a second bump structure 240 on the basis of a flip chip scheme. According to embodiments, an under-fill material layer provided adjacent to and surrounding the second bump structure 240 may be disposed between the base chip 201 and a corresponding semiconductor chip 210 or between adjacent semiconductor chips 210. The under-fill material layer may include, for example, epoxy resin formed by a capillary under-fill process. However, in some embodiments, a first molding member 250 may be filled into a gap between the base chip 201 and a corresponding semiconductor chip 210 or between adjacent semiconductor chips 210 through a molded under-fill process. In this case, the under-fill material layer may be omitted.

A first bump structure 230 disposed on a lower surface of the base chip 201 may be electrically connected with a through via 220 which is formed in the base chip 201. Also, the through via 220 formed in the semiconductor chips 210 may be electrically connected with a second bump structure 240. The through via 220 may pass through each of the base chip 201 and the semiconductor chips 210. The through via 220 may extend in a vertical direction Z. The through via 220 may have a tapered shape where a horizontal-direction width thereof decreases or increases as a level in the vertical direction Z increases. At least a portion of the through via 220 may have a pillar shape. The through via 220 may be a through silicon via (TSV).

The first chip structure 200 may further include the first molding member 250 which is provided adjacent to and surrounds the first base chip 201 and the semiconductor chips 210. The semiconductor chips 210 on the base chip 201 may be sealed by the first molding member 250. However, as illustrated in FIG. 3, a top-layer semiconductor chip 211, disposed uppermost, of the semiconductor chips 210 may not be covered by the first molding member 250. However, embodiments are not limited thereto, and the top-layer semiconductor chip 211 may be covered by the first molding member 250.

According to embodiments, the first molding member 250 may include thermocurable resin such as epoxy resin, thermoplastic resin such as polyimide, or resin including a reinforcing agent such as an inorganic filler, and in detail, may include an Ajinomoto build-up film (ABF), frame retardant 4 (FR-4), or bismaleimide triazine (BT), but the first molding member 250 is not limited thereto and may include a molding material, such as epoxy mold compound (EMC), or a photosensitive material such as a photo-imagable encapsulant (PIE). In some embodiments, a portion of the first molding member 250 may include an insulation material such as silicon oxide, silicon nitride, or silicon oxynitride.

According to embodiments, the top-layer semiconductor chip 211 may have a vertical-direction thickness which is within a range of about 50 μm to about 100 μm. That is, a vertical-direction thickness of the top-layer semiconductor chip 211 may be within a range of about 50 μm to about 100 μm. According to embodiments, a sum of vertical-direction thicknesses of the top-layer semiconductor chip 211, the first adhesive layer 310, and the heat dissipation member 300 may be within a range of about 150 μm to about 200 μm.

In FIG. 3, five stacked semiconductor chips 210 are illustrated, but embodiments are not limited thereto, and the first chip structure 200 may include one or more semiconductor chips 210.

Figure 4:
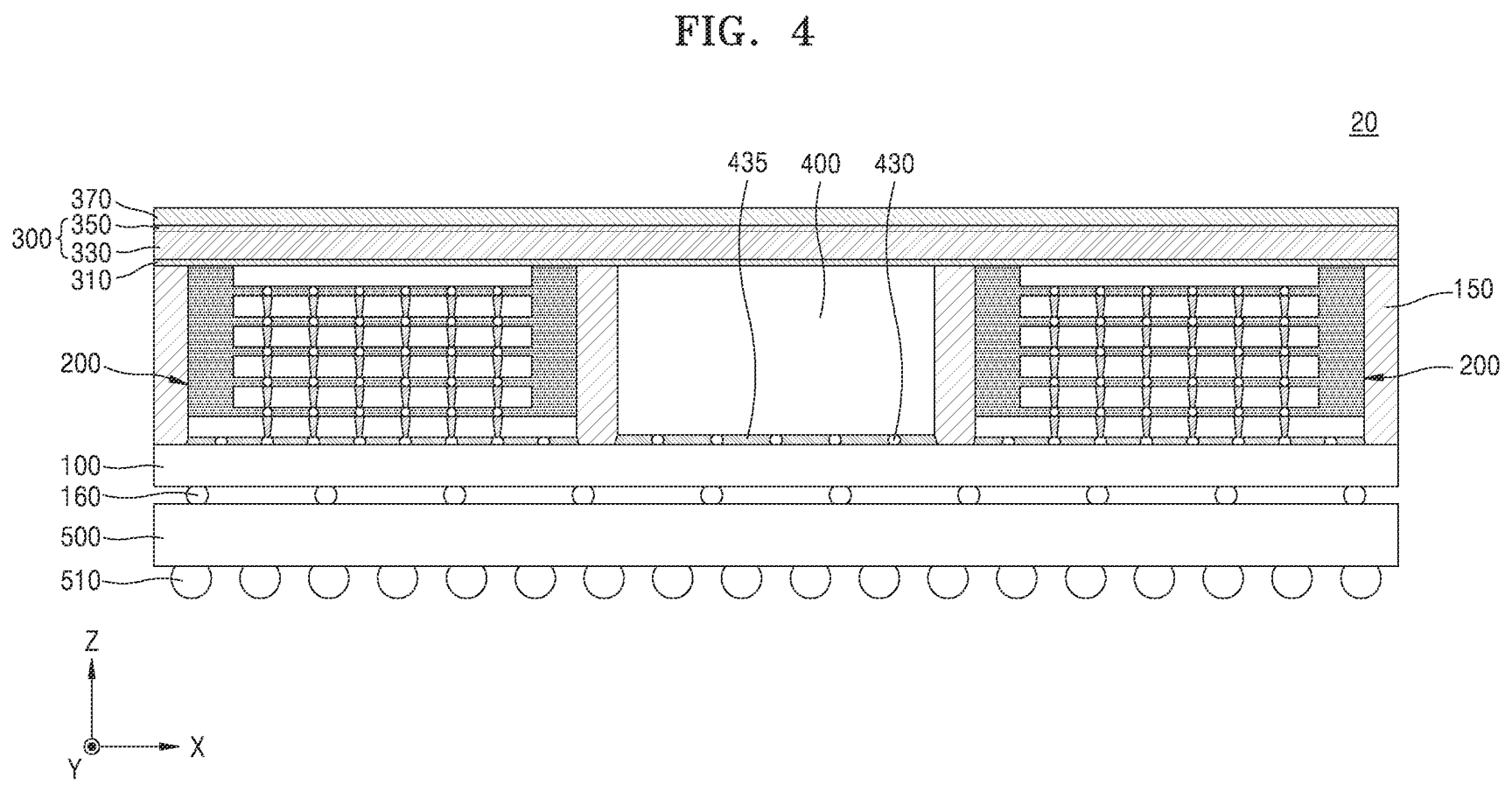

FIG. 4 is a cross-sectional view schematically illustrating a semiconductor package 20 according to an embodiment. Hereinafter, descriptions of the semiconductor package 20 of FIG. 4 which are the same as or similar to the descriptions of the semiconductor package 10 of FIG. 1 may be omitted, and a difference therebetween is mainly described.

Referring to FIG. 4, the semiconductor package 20 may include a package substrate 500, a second external connection terminal 510, a first substrate 100, a first external connection terminal 160, a first chip structure 200, a second chip structure 400, a second molding member 150, a first adhesive layer 310, a heat dissipation member 300, and a metal TIM 370.

The package substrate 500 may be a supporting substrate with the first substrate 100 disposed thereon and may include a one or more layer wiring therein. When the wiring includes a multilayer, wirings of the other layers may be connected with each other through a via. In some embodiments, the package substrate 500 may include a through via which connects a pad, disposed on an upper surface thereof, with a pad disposed on a lower surface thereof. Passivation layers such as a solder resist may be formed on the upper surface and the lower surface of the package substrate 500. Substrate pads of the package substrate 500 may be connected with wirings of a wiring layer and may be exposed from the passivation layer.

The second external connection terminal 510 may be disposed on the lower surface of the package substrate 500. The second external connection terminal 510 may be electrically connected with an external device, for example, a mother board. The second external connection terminal 510 may be electrically connected with the package substrate 500. The second external connection terminal 510 may be electrically connected to wiring patterns, formed in the package substrate 500, through a substrate pad attached on the lower surface of the package substrate 500. The second external connection terminal 510 may electrically and physically connect the semiconductor package 20 to an external device with the semiconductor package 20 disposed thereon.

The first substrate 100 may be disposed on the package substrate 500. The first substrate 100 may be electrically connected with the package substrate 500 through the first external connection terminal 160. The first substrate 100 may include an interposer substrate. The first substrate 100 may include a silicon (Si) interposer substrate having a 2.5-dimensional (2.5D) package structure. According to embodiments, the first substrate 100 may electrically connect the first chip structure 200 with the second chip structure 400, and the first chip structure 200 and the second chip structure 400 may be electrically connected with the package substrate 500 through the first substrate 100. The first substrate 100 may include a base layer and a redistribution structure disposed on the base layer. The first substrate 100 may electrically connect the first chip structure 200 with the second chip structure 400 through a redistribution pattern which is formed in the redistribution structure. A through via may be formed in the base layer and may be electrically connected with the redistribution pattern of the redistribution structure. Accordingly, the first substrate 100 may electrically connect the first chip structure 200 and the second chip structure 400 with the package substrate 500 through the through via formed in the base layer.

The first chip structure 200 and the second chip structure 400 may be disposed on the first substrate 100 and may be arranged in a first horizontal direction X on the first substrate 100. For example, the first chip structure 200 and the second chip structure 400 may be arranged to be spaced apart from each other in the first horizontal direction X on the first substrate 100.

The first chip structure 200 and the second chip structure 400 may each include at least one semiconductor chip. According to embodiments, the first chip structure 200 and the second chip structure 400 may each include semiconductor chips which are disposed in a vertical direction Z. According to embodiments, at least one of the first chip structure 200 and the second chip structure 400 may include the HBM package described above with reference to FIG. 3, and the other of the first chip structure 200 and the second chip structure 400 may include an application specific integrated circuit (ASIC) package including a logic chip.

According to embodiments, the first chip structure 200 may include the HBM package, and the second chip structure 400 may include the ASIC package. In FIG. 4, it is illustrated that three chip structures are disposed on the first substrate 100, but two or more chip structures may be disposed on the first substrate 100.

According to embodiments, the second chip structure 400 may be the ASIC package and may be disposed at a center of an upper portion of the first substrate 100. According to embodiments, the second chip structure 400 may be disposed on the first substrate 100 through a third bump structure 430, based on a flip chip scheme. According to embodiments, an under-fill material layer 435 provided adjacent to and surrounding the third bump structure 430 may be disposed between the second chip structure 400 and the first substrate 100. However, in some embodiments, a second molding member 150 may be directly filled into a gap between the second chip structure 400 and the first substrate 100 through a molded under-fill process. In this case, the under-fill material layer 435 may be omitted. Adjacent first chip structures 200 may be spaced apart from each other in the first horizontal direction X with the second chip structure 400 therebetween. For example, chip structures may be arranged on the first substrate 100 in the order of the first chip structure 200, the second chip structure 400, and the first chip structure 200 in the first horizontal direction X.

The second molding member 150 on the first substrate 100 may be provided adjacent to and surround the first chip structure 200 and the second chip structure 400. The second molding member 150 may be provided on and cover an upper surface of the first substrate 100 and may be provided on and cover a sidewall of each of the first chip structure 200 and the second chip structure 400. In embodiments, the second molding member 150 may be provided on and cover the sidewalls of the first chip structure 200 and the second chip structure 400 and may not be provided on and cover upper surfaces of the first chip structure 200 and the second chip structure 400. The second molding member 150 may include epoxy resin and an inorganic filler and/or an organic filler each included in the epoxy resin. In embodiments, the second molding member 150 may include EMC.

According to embodiments, the upper surfaces of the first chip structure 200 and the second chip structure 400 may be disposed at the same level in a vertical direction Z. That is, the upper surfaces of the first chip structure 200 and the second chip structure 400 may be disposed at substantially the same height. According to embodiments, an upper surface of the second molding member 150 may be on the same plane as the upper surfaces of the first chip structure 200 and the second chip structure 400.

The first adhesive layer 310 may be disposed on the upper surfaces of the first chip structure 200, the second chip structure 400, and the second molding member 150. In some embodiments, the upper surfaces of the first chip structure 200, the second chip structure 400, and the second molding member 150 may be arranged at the same level in the vertical direction X, and thus, the first adhesive layer 310 may extend in the first horizontal direction X. The first adhesive layer 310 may be provided as one body on the upper surfaces of the first chip structure 200, the second chip structure 400, and the second molding member 150.

The heat dissipation member 300 may be disposed on the first chip structure 200, the second chip structure 400, and the second molding member 150. According to embodiments, the heat dissipation member 300 may be attached on the upper surfaces of the first chip structure 200, the second chip structure 400, and the second molding member 150 by using the first adhesive layer 310.

In some embodiments, the upper surfaces of the first chip structure 200, the second chip structure 400, and the second molding member 150 may be arranged on the same plane, and thus, the heat dissipation member 300 may extend in the first horizontal direction X. That is, a lower surface and an upper surface of a heat dissipation plate of the heat dissipation member 300 may be substantially a flat plate.

The heat dissipation member 300 may include a seed metal layer 350 which is formed on the upper surface of the heat dissipation plate 330, and the metal TIM 370 may be formed on the seed metal layer 350 by the seed metal layer 350.

As a result, the semiconductor package 20 may more efficiently dissipate heat, occurring in the semiconductor package 20, externally through the heat dissipation member 300 and the metal TIM 370 each provided on the upper surfaces of the first chip structure 200, the second chip structure 400, and the second molding member 150.

Figure 5:
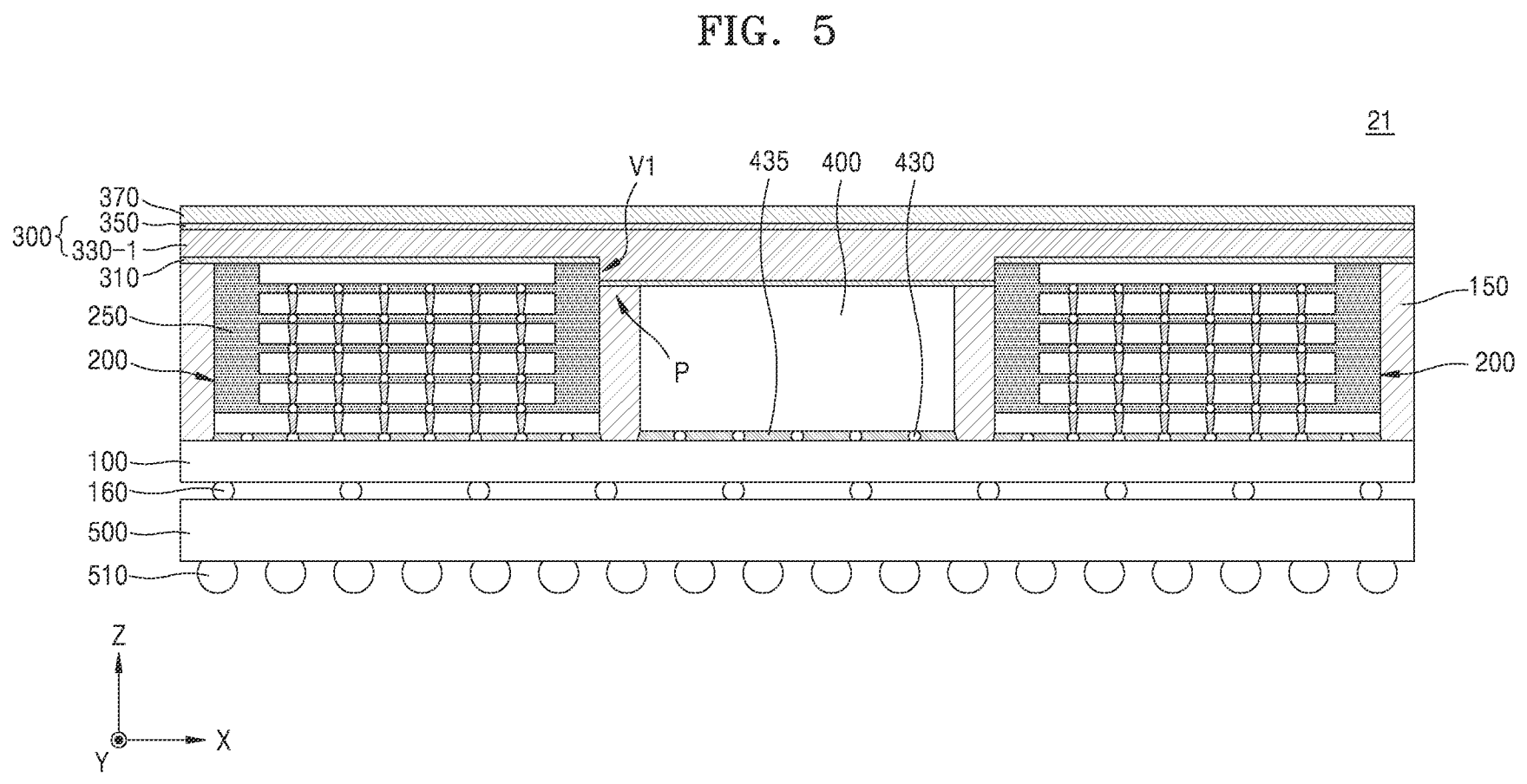

FIG. 5 is a cross-sectional view schematically illustrating a semiconductor package 21 according to an embodiment. Hereinafter, descriptions of the semiconductor package 21 of FIG. 5 which are the same as or similar to the descriptions of the semiconductor package 20 of FIG. 4 may be omitted, and a difference therebetween is mainly described.

Referring to FIG. 5, the semiconductor package 21 may include a package substrate 500, a second external connection terminal 510, a first substrate 100, a first external connection terminal 160, a first chip structure 200, a second chip structure 400, a second molding member 150, a first adhesive layer 310, a heat dissipation member 300, and a metal TIM 370.

The first chip structure 200 and the second chip structure 400 may be arranged to be spaced apart from each other in a first horizontal direction X on the first substrate 100. According to embodiments, an upper surface of the second chip structure 400 may be disposed at a vertical level which is lower than an upper surface of the first chip structure 200. The height of the second chip structure 400 in a vertical direction Z may be smaller than the height of the first chip structure 200.

The first adhesive layer 310 may be disposed on each of the upper surface of the first chip structure 200 and the upper surface of the second chip structure 400. Accordingly, the first adhesive layer 310 provided on the upper surface of the first chip structure 200 and the first adhesive layer 310 provided on the upper surface of the second chip structure 400 may be at different levels in a vertical direction Z. In some embodiments, a vertical-direction Z level of the first adhesive layer 310 provided on the upper surface of the first chip structure 200 may be higher than a vertical-direction Z level of the first adhesive layer 310 provided on the upper surface of the second chip structure 400.

The heat dissipation member 300 may include a heat dissipation plate 330-1 and a seed metal layer 350 formed on an upper surface of the heat dissipation plate 330-1. In some embodiments, a protrusion portion P may be formed on a lower surface of the heat dissipation plate 330-1. The protrusion portion P may protrude from the lower surface of the heat dissipation plate 330-1 by a vertical-level step between the first chip structure 200 and the second chip structure 400. Therefore, the upper surface of the heat dissipation plate 330-1 may have a plate shape, and the lower surface of the heat dissipation plate 330-1 may be attached on the upper surface of the second chip structure 400 through the first adhesive layer 310.

The lower surface of the heat dissipation plate 330-1 may include a first surface V1 which extends in the vertical direction Z, based on the protrusion portion P formed on the lower surface of the heat dissipation plate 330-1. The first surface V1 may contact a sidewall of the first molding member 250.

The second molding member 150 may be provided adjacent to and surround the first chip structure 200 and the second chip structure 400. In some embodiments, an upper surface of the second molding member 150 surrounding a sidewall of the second chip structure 400 may be disposed at a vertical-direction Z level which is lower than the upper surface of the first molding member 150 surrounding the sidewall of the second chip structure 200.

As a result, even when the upper surfaces of the first chip structure 200 and the second chip structure 400 are disposed at different levels in the vertical direction Z, the metal TIM 370 having a certain thickness may be formed based on the seed metal layer 350 formed on the upper surface of the heat dissipation plate 330-1 which is a flat plate, and the heat dissipation member 300 may be more stably disposed on the first chip structure 200 and the second chip structure 400, based on the lower surface of the heat dissipation plate 330-1 including the protrusion portion P.

Figure 6:
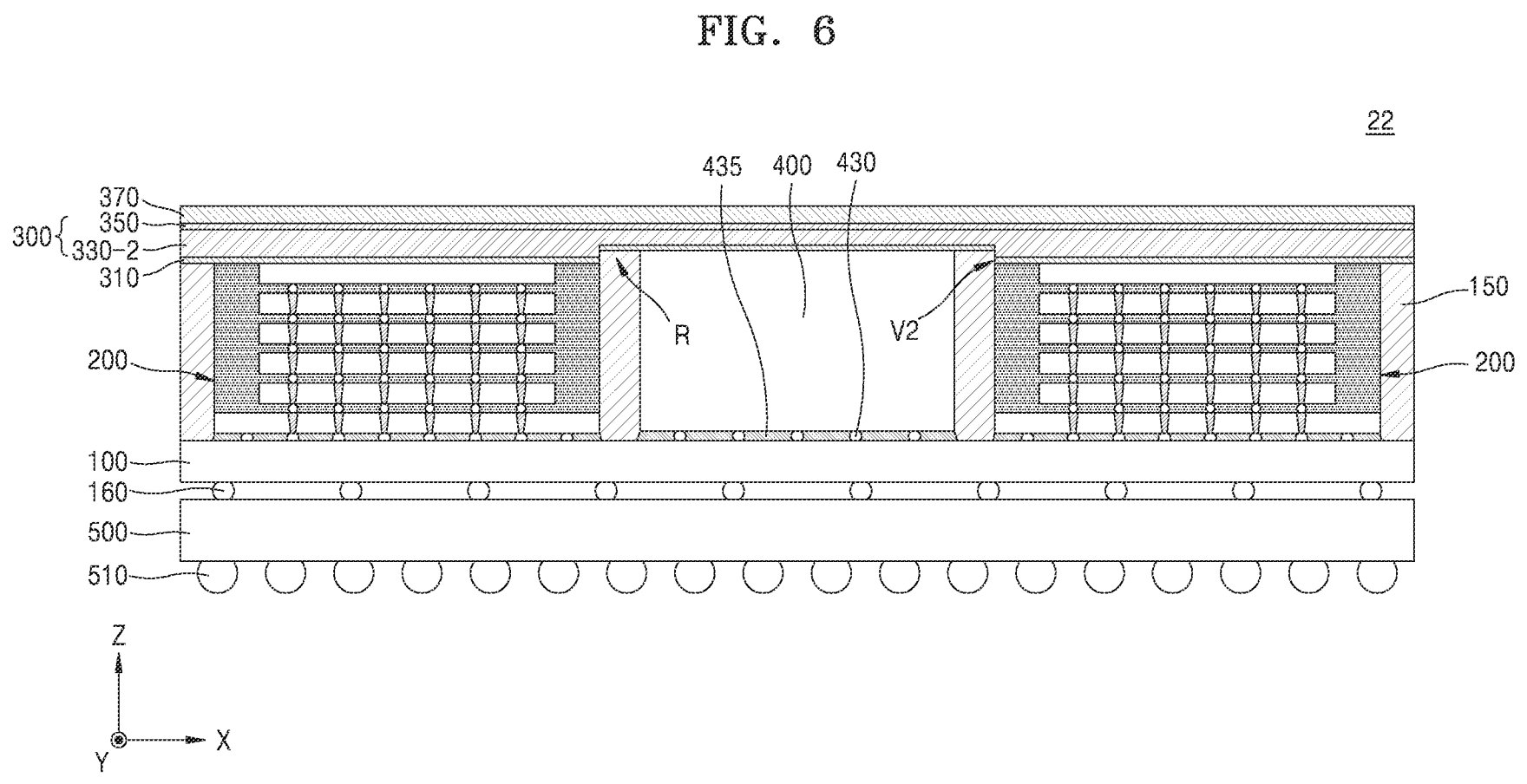

FIG. 6 is a cross-sectional view schematically illustrating a semiconductor package 22 according to an embodiment. Hereinafter, descriptions of the semiconductor package 22 of FIG. 6 which are the same as or similar to the descriptions of the semiconductor package 20 of FIG. 4 may be omitted, and a difference therebetween is mainly described.

Referring to FIG. 6, the semiconductor package 22 may include a package substrate 500, a second external connection terminal 510, a first substrate 100, a first external connection terminal 160, a first chip structure 200, a second chip structure 400, a second molding member 150, a first adhesive layer 310, a heat dissipation member 300, and a metal TIM 370.

The first chip structure 200 and the second chip structure 400 may be arranged to be spaced apart from each other in a first horizontal direction X on the first substrate 100. According to embodiments, an upper surface of the second chip structure 400 may be disposed at a vertical level which is higher than an upper surface of the first chip structure 200.

The first adhesive layer 310 may be disposed on each of the upper surface of the first chip structure 200 and the upper surface of the second chip structure 400. Accordingly, the first adhesive layer 310 provided on the upper surface of the first chip structure 200 and the first adhesive layer 310 provided on the upper surface of the second chip structure 400 may be at different levels in a vertical direction Z. In some embodiments, a vertical-direction Z level of the first adhesive layer 310 provided on the upper surface of the first chip structure 200 may be lower than a vertical-direction Z level of the first adhesive layer 310 provided on the upper surface of the second chip structure 400.

The heat dissipation member 300 may include a heat dissipation plate 330-2 and a seed metal layer 350 formed on an upper surface of the heat dissipation plate 330-2. In some embodiments, a recess R may be formed in a lower surface of the heat dissipation plate 330-2. The recess R may protrude from the lower surface of the heat dissipation plate 330-2 by a vertical-level step between the first chip structure 200 and the second chip structure 400. The upper surface of the heat dissipation plate 330-2 may have a plate shape, and the lower surface of the heat dissipation plate 330-2 may be attached on the upper surface of the second chip structure 400 through the first adhesive layer 310.

The lower surface of the heat dissipation plate 330-2 may include a second surface V2 which extends in the vertical direction Z, based on the recess R formed in the lower surface of the heat dissipation plate 330-2. The second surface V2 may contact a sidewall of the second molding member 150.

The second molding member 150 may be provided adjacent to and surround the first chip structure 200 and the second chip structure 400. In some embodiments, an upper surface of the second molding member 150 surrounding a sidewall of the second chip structure 400 may be disposed at a vertical-direction Z level which is higher than the upper surface of the first molding member 150 surrounding the sidewall of the second chip structure 200.

As a result, even when the upper surfaces of the first chip structure 200 and the second chip structure 400 are disposed at different levels in the vertical direction Z, the metal TIM 370 having a certain thickness may be formed based on the seed metal layer 350 formed on the upper surface of the heat dissipation plate 330-2 which is a flat plate, and the heat dissipation member 300 may be more stably disposed on the first chip structure 200 and the second chip structure 400, based on the lower surface of the heat dissipation plate 330-2 including the recess R.

Hereinabove, embodiments have been described in the drawings and the specification. Embodiments have been described by using the terms described herein, but this has been merely used for describing the present disclosure and has not been used for limiting a meaning or limiting the scope defined in the following claims and their equivalents. Therefore, it may be understood by those of ordinary skill in the art that various modifications and other equivalent embodiments may be implemented from the present disclosure. Accordingly, the spirit and scope of the present disclosure may be defined based on the spirit and scope of the following claims and their equivalents.

While embodiments have been shown and described with reference to embodiments thereof, it will be understood that various changes in form and details may be made therein without departing from the spirit and scope of the following claims and their equivalents.

What is claimed is:

1. A semiconductor package comprising:

a first substrate;

a first chip structure on the first substrate, the first chip structure comprising at least one chip;

a heat dissipation member on the first chip structure, the heat dissipation member comprising:

a heat dissipation plate comprising a first surface facing the first chip structure and a second surface opposite to the first surface; and a seed metal layer on the second surface of the heat dissipation plate;

a metal thermal interfacial material (TIM) on the seed metal layer; and a first adhesive layer between the first chip structure and the heat dissipation member.

2. The semiconductor package of claim 1, wherein the first chip structure comprises a plurality of chips in a vertical direction.

3. The semiconductor package of claim 2, wherein the first chip structure comprises a high bandwidth memory (HBM) package.

4. The semiconductor package of claim 3, wherein a thickness of a top-layer semiconductor chip, disposed uppermost, of the plurality of chips disposed in the first chip structure is within a range of 50 μm to 100 μm.

5. The semiconductor package of claim 1, wherein the first adhesive layer comprises a die attach film.

6. The semiconductor package of claim 1, wherein the seed metal layer comprises:

a first layer on the second surface of the heat dissipation plate, the first layer comprising titanium;

a second layer on the first layer, the second layer comprising nickel; and a third layer on the second layer, the third layer comprising gold.

7. The semiconductor package of claim 1, wherein the seed metal layer comprises seed metal for forming the metal TIM.

8. The semiconductor package of claim 1, wherein a thermal conductivity of the metal TIM is within a range of 50 W/mK to 100 W/mK.

9. The semiconductor package of claim 1, wherein the first chip structure comprises a high bandwidth memory (HBM) package comprising a plurality of chips in a vertical direction, and wherein the seed metal layer comprises:

a first layer on the second surface of the heat dissipation plate, the first layer comprising titanium;

a second layer on the first layer, the second layer comprising nickel; and a third layer on the second layer, the third layer comprising gold.

10. A semiconductor package comprising:

a first substrate;

a first chip structure and a second chip structure in a horizontal direction on the first substrate;

a heat dissipation member on the first chip structure and the second chip structure, the heat dissipation member comprising:

a heat dissipation plate that comprises a first surface facing the first chip structure and the second chip structure and a second surface opposite to the first surface; and a seed metal layer on the second surface of the heat dissipation plate;

a metal thermal interfacial material (TIM) on the seed metal layer; and a first adhesive layer between the first surface of the heat dissipation plate and the first chip structure and between the first surface of the heat dissipation plate and the second chip structure.

11. The semiconductor package of claim 10, wherein one of the first chip structure and the second chip structure comprises a logic chip, and wherein the other of the first chip structure and the second chip structure comprises a high bandwidth memory (HBM) package comprising a plurality of memory chips in a vertical direction.

12. The semiconductor package of claim 10, further comprising a package substrate on a lower surface of the first substrate, wherein the first substrate comprises an interposer substrate electrically connecting the first chip structure, the second chip structure, and the package substrate with one another.

13. The semiconductor package of claim 10, wherein each of the first surface and the second surface of the heat dissipation plate is a substantially flat surface.

14. The semiconductor package of claim 10, wherein the first surface of the heat dissipation plate comprises a surface extending in a vertical direction.

15. The semiconductor package of claim 10, wherein the seed metal layer comprises:

a first layer on the second surface of the heat dissipation plate, the first layer comprising titanium;

a second layer on the first layer, the second layer comprising nickel; and a third layer on the second layer, the third layer comprising gold.

16. The semiconductor package of claim 10, wherein the seed metal layer comprises seed metal for forming the metal TIM.

17. A semiconductor package comprising:

a package substrate;

an interposer substrate on the package substrate;

a first chip structure on the interposer substrate, the first chip structure comprising at least one chip;

a second chip structure on the interposer substrate and spaced apart from the first chip structure in a horizontal direction;

a heat dissipation member on the first chip structure and the second chip structure, the heat dissipation member comprising:

a heat dissipation plate that comprises a first surface facing the first chip structure and the second chip structure and a second surface opposite to the first surface; and a seed metal layer on the second surface of the heat dissipation plate;

a first adhesive layer between the first chip structure and the heat dissipation member; and a metal thermal interfacial material (TIM) on the seed metal layer, wherein one of the first chip structure and the second chip structure comprises a logic chip, and the other of the first chip structure and the second chip structure comprises a high bandwidth memory (HBM) package comprising a plurality of memory chips in a vertical direction, and wherein the seed metal layer comprises seed metal for forming the metal TIM.

18. The semiconductor package of claim 17, wherein a thermal conductivity of the metal TIM is within a range of 50 W/mK to 100 W/mK.

19. The semiconductor package of claim 17, wherein the first adhesive layer comprises a die attach film.

* * * * *